United States Patent [19]

Komatsu

[11] 4,279,671
[45] * Jul. 21, 1981

[54] METHOD FOR MANUFACTURING A SEMICONDUCTOR DEVICE UTILIZING DOPANT PREDEPOSITION AND POLYCRYSTALLINE DEPOSITION

[75] Inventor: Shigeru Komatsu, Yokohama, Japan

[73] Assignee: Tokyo Shibaura Denki Kabushiki Kaisha, Japan

[*] Notice: The portion of the term of this patent subsequent to Sep. 23, 1997, has been disclaimed.

[21] Appl. No.: 954,326

[22] Filed: Oct. 24, 1978

[30] Foreign Application Priority Data

Nov. 10, 1977 [JP] Japan .................. 52/134096

[51] Int. Cl.³ .............. H01L 21/225; H01L 21/20
[52] U.S. Cl. .......................... 148/188; 29/578;
29/590; 148/174; 148/187; 148/190; 148/191;
357/34; 357/59; 357/65; 427/85; 427/86
[58] Field of Search ........... 148/174, 188, 191, 187,
148/190; 29/578, 590; 427/82, 85, 86; 357/34,
59, 63, 65

[56] References Cited

U.S. PATENT DOCUMENTS 3,839,104 10/1974 Yuan ..................... 148/191 X
3,860,836 1/1975 Pedersen .................. 357/59 X
3,879,230 4/1975 Nakamura et al. ........... 148/188 X
3,904,450 9/1975 Evans et al. ................ 148/175
3,928,095 12/1975 Harigaya et al. ........... 148/174 X
4,013,489 3/1977 Oldham ...................... 148/174
4,063,967 12/1977 Graul et al. ............... 148/188 X
4,069,067 1/1978 Ichinohe .................... 148/187 X
4,144,106 3/1979 Takeuchi ................... 148/174 X
4,146,413 3/1979 Yonezawa et al. ............ 148/174
4,187,514 2/1980 Tomisawa et al. ............ 357/59 X

OTHER PUBLICATIONS

Chang et al., "Fabrication of Junction Insulating Gate FET," I.B.M. Tech. Discl. Bull., vol. 13, No. 9, Feb. 1971, p. 2503.

Primary Examiner—R. Dean
Assistant Examiner—W. G. Saba
Attorney, Agent, or Firm—Finnegan, Henderson, Farabow, Garrett & Dunner

[57] ABSTRACT

A method for manufacturing a npn-type transistor includes steps of depositing phosphorus on a base region, covering the deposited phosphorus with a polycrystalline silicon layer and heating the deposited phosphorus to diffuse it into the base region to form an emitter region.

18 Claims, 16 Drawing Figures

METHOD FOR MANUFACTURING A SEMICONDUCTOR DEVICE UTILIZING DOPANT PREDEPOSITION AND POLYCRYSTALLINE DEPOSITION

BACKGROUND OF THE INVENTION

This invention relates to a method for manufacturing a semiconductor device such as a transistor having an n-type region in a p-type region.

In semiconductor devices like transistors, an emitter region is formed by diffusing arsenic with a low diffusion speed in order to form a shallow emitter-base junction. However, vapor diffusion of arsenic, which is poisonous, involves a risk. On the other hand, solid arsenic diffusion by using arsenic-doped silicate glass (AsSG) will frequently cause lattice defects at the interface between such glass and substrate, leading to deterioration in electrical characteristics. Moreover, transistors which have an emitter region formed by the use of arsenic are subject to very low emitter-base reverse withstand voltage.

In order to eliminate the above defects of the arsenic diffusion, there has been proposed the use of phosphorus as an impurity. Having a substantially higher diffusion coefficient when compared with arsenic, however, phosphorus requires a low-temperature diffusion process. In addition, such low-temperature diffusion may not allow satisfactory getter treatment of alkali metals such as sodium that may exist at the interface between an insulating film and semiconductor substrate. Furthermore, in implanting phosphorus ions into the semiconductor substrate by the ion-implantation method, these phosphorus ions must be activated at a temperature of approximately 950° C. to 1,000° C. after such implantation. Such high-temperature treatment will, however, rediffuse the impurity to prevent high-accuracy control of diffusion depth.

SUMMARY OF THE INVENTION

Accordingly, the object of this invention is to provide a method for manufacturing a semiconductor device which is capable of producing an effect peculiar to phosphorus by the use of phosphorus as an impurity for diffusion and is also capable of accurately controlling the diffusion depth under easy diffusing conditions.

DETAILED DESCRIPTION OF THE PREFERRED EMBODIMENTS

Now there will be described the method for manufacturing a semiconductor device according to an embodiment of this invention with reference to the accompanying drawings.

Figure 1A:
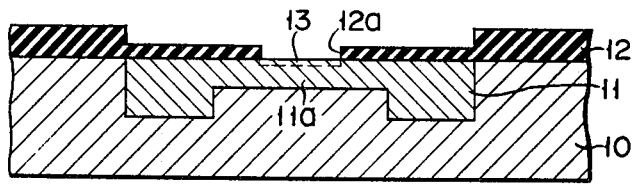
FIGS. 1A to 1E are views for illustrating the method for manufacturing a semiconductor device according to an embodiment of this invention.

FIGS. 1A to 1E are schedule views for the manufacture of an npn-type planar transistor. First, boron is vapor-diffused selectively into one side of an n-type silicon substrate 10 to form a gard-ring-shaped p-type base region 11 with a shallow central portion 11a. The one side of the substrate 10 is covered with a silicon dioxide film or insulating film 12 by the thermal oxidation method, and then an opening 12a, through which part of the top of the central portion 11a of the base region 11 is exposed, is formed. Subsequently, the resultant structure is exposed to an oxidizing atmosphere of phosphorus oxychloride at 950° C., so that phosphorus is deposited on the part of the top of the central portion 11a which is exposed through the opening 12a. By this deposition process, phosphorus slightly penetrates the part of the top of the central portion 11a, thereby forming a shallow n-type region 13 with a high impurity concentration and a depth of approximately 0.1 $\mu$, as shown in FIG. 1A. A phosphorus glass film, which is formed on the surface of the n-type region 13 at time of such deposition, may be removed with dilute hydrofluoric acid to eliminate difficulties in subsequent processes.

Figure 1B:
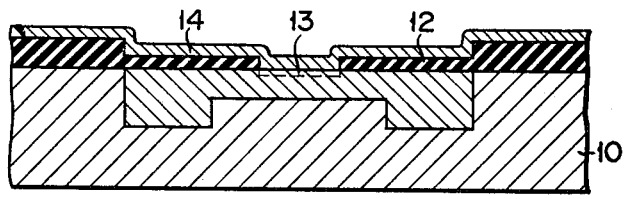

Next, by the vapor-growth of silicon at 650° C., a polycrystalline silicon layer 14 which does not positively contain impurities is formed on the silicon dioxide film 12 and n-type region 13 to a thickness of about 4,000 A, as shown in FIG. 1B.

Figure 1C:
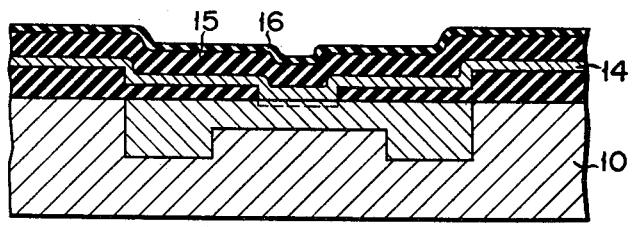

Subsequently, a silicon dioxide layer 15 is formed on the polycrystalline silicon layer 14 to a thickness of about 5,000 A through low-temperature vapor-growth of silicon. Then, the resultant structure is exposed to a phosphorus oxychloride atmosphere at about 1,000° C. for 10 to 15 minutes to form a phosphorus-doped silicon glass layer 16 on the surface of the silicon dioxide layer 15, as shown in FIG. 1C. Since alkali metals in the vicinity of the interface between the silicon substrate 10 and the silicon dioxide layer 12 are absorbed by the silicon glass layer 16 during the formation of the silicon glass layer 16, such forming process is called a getter process or treatment.

Figure 1D:
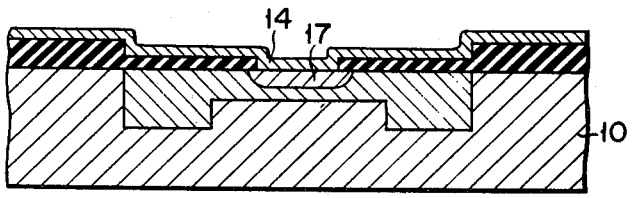

Thereafter, the getter film or phosphorus-doped silicon glass layer 16 and the silicon dioxide layer 15 are successively removed by etching. Next, the remaining structure is heated at 1,000° C. for 40 minutes to diffuse phosphorus in the n-type region 13 so as to form an n-type emitter region 17 in the base region 11 as shown in FIG. 1D. This phosphorus diffusion is achieved in such a manner that more phosphorus may be also diffused into the polycrystalline silicon layer 14, since the diffusion coefficient of polycrystalline silicon is far larger than that of single-crystal silicon.

Alternately, the diffusion of phosphorus may be made only after removing the phosphorus-doped silicon glass layer 16, and thereafter the the silicon dioxide layer 15 may be removed.

Figure 1E:
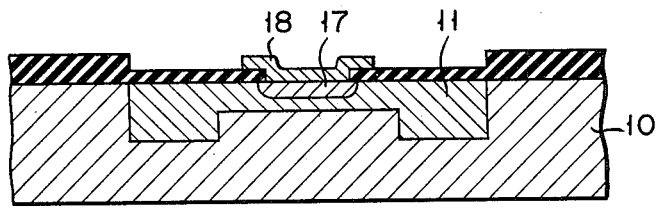

Then, as shown in FIG. 1E, a polycrystalline silicon electrode 18 is formed by etching the polycrystalline silicon layer 14 except the portion on and around the emitter region 17. Since the emitter electrode 18 formed in this manner is sufficiently doped with phosphorus, its transistor forward characteristic will not be deteriorated, and there will be no fear of the electrode penetrating the emitter region as is the case with the formation of an aluminium electrode, for example. In the thus formed npn-type transistor, the emitter grounding current amplification factor $\beta = 100$ and $V_{CEO} \sim 25$ V.

Figure 2:
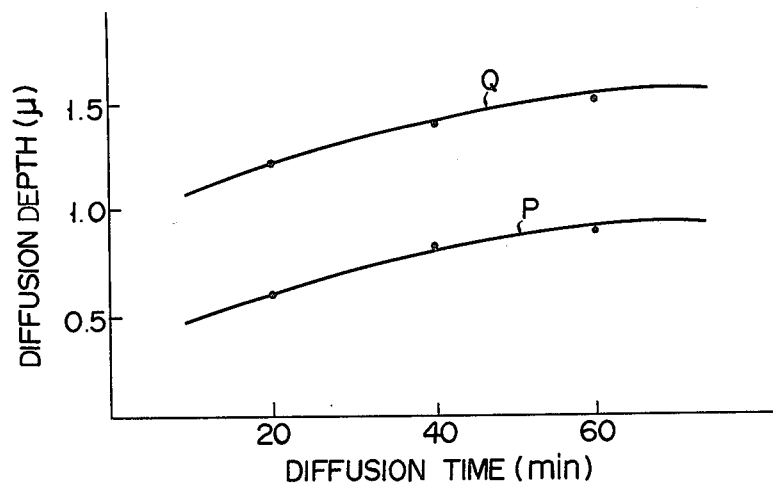
FIGS. 2 and 3 are graphs showing the relations between the phosphorus diffusion time and the diffusion depth according to the method of this invention and the prior art method, respectively.
Figure 3:
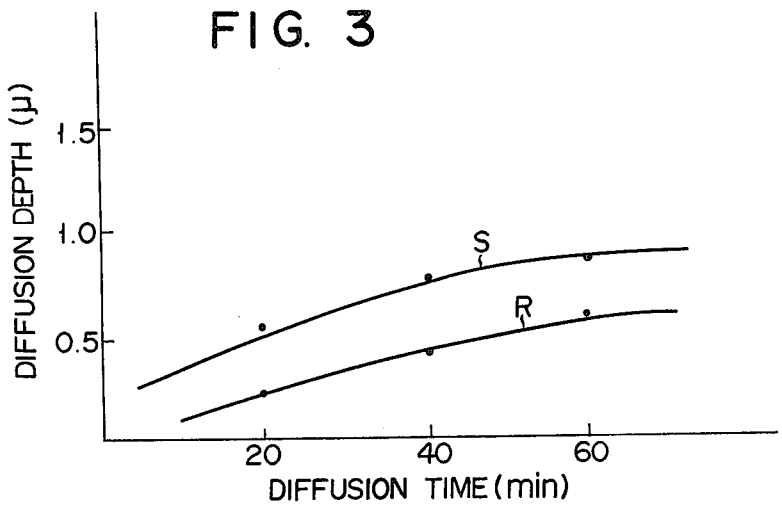

FIGS. 2 and 3 show the relation between the phosphorus diffusion time and the diffusion depth of the emitter region. In these Figures, the diffusion depth of the emitter region and the diffusion time are plotted on the ordinate and abscissa respectively. FIGS. 2 and 3 show cases where the diffusion temperatures are respectively 1,000° C. and 950° C. In FIGS. 2 and 3, curves P and R represent the case of the method of the aforementioned embodiment, while curves Q and S represent the case of the prior art method where no polycrystalline silicon film is used in emitter diffusion.

According to the method of the aforesaid embodiment, as may be clear from FIGS. 2 and 3, the control of diffusion may substantially be facilitated because, with the same diffusion time, the diffusion speed of phosphorus is halved. Naturally, the getter film may be formed at a high temperature of 950° C. to 1,000° C., so that satisfactory getter effect can be obtained.

Although the method of manufacturing the planar transistor has been described according to the above embodiment, the spirit of this invention may be applied also to a method for manufacturing some other type of semiconductor device. Referring now to FIGS. 4A to 4D, therefore, there will be described a method for manufacturing a junction FET, as an example.

Figure 4A:
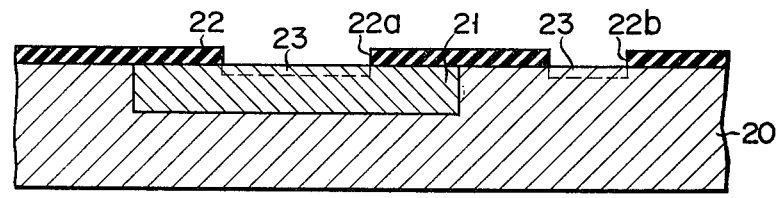
FIGS. 4A to 4D are views showing the method for manufacturing a semiconductor device according to another embodiment of the invention.

An n-type silicon substrate 20 is prepared, and a p-type selectively diffusing boron. Then the one side of the substrate 20 is covered with a silicon dioxide film 22 by thermal oxidation, and parts of the film 22 on the island region 21 and on the substrate 20 are removed by etching to form openings 22a and 22b. Subsequently, the resultant structure is exposed to an oxidizing atmosphere of phosphorus oxychloride at 950° C., and phosphorus is deposited on the portions of the island region 21 and the substrate 20 at which high-concentration n-type regions 23 are formed at each such portion, as shown in FIG. 4A.

Figure 4B:
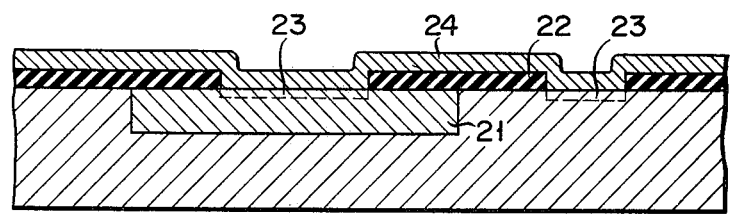

Thereafter, like the case of the aforementioned embodiment, phosphorus glass on the n-type region 23 is removed with dilute hydrofluoric acid, and then a polycrystalline silicon layer 24 is formed on the n-type regions 23 and the silicon dioxide film 22, as shown in FIG. 4B. Further, a silicon dioxide layer and phosphorus-doped silicon glass layer are successively formed on the polycrystalline silicon film 24, getter-processed, and then removed by etching. The resultant structure is heated at 1,000° C. for 40 minutes, so that phosphorus in the n-type regions 23 are diffused shallowly into the island region 21 and the substrate 20 to respectively form pn junctions 25, and diffused also into the polycrystalline silicon film 24.

Figure 4C:
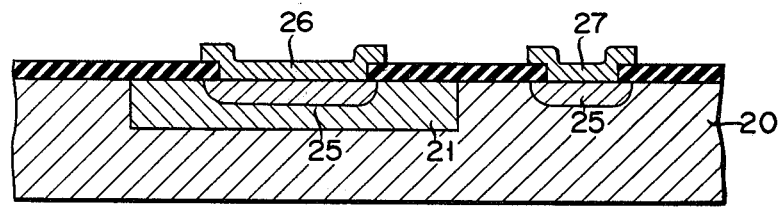

Then, as shown in FIG. 4C, a gate electrode 26 and a back gate electrode 27 are formed by selectively etching away the polycrystalline silicon film 24, except at gates 26 and 27.

Figure 4D:
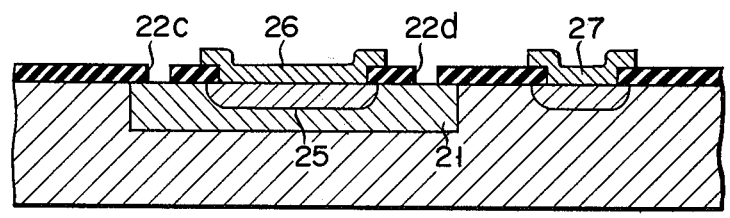

Subsequently, portions of the silicon dioxide film 22 on the island region 21 at each side of the gate electrode 26 are etched to form openings 22c and 22d for the formation of source and drain electrodes, as shown in FIG. 4D. Thereafter, the source and drain electrodes are separately formed by a conventional method, e.g., evaporation and selective etching of aluminium, and thus a junction FET is formed.

Further embodiment will be described with reference to FIGS. 5A to 5E.

Figure 5A:
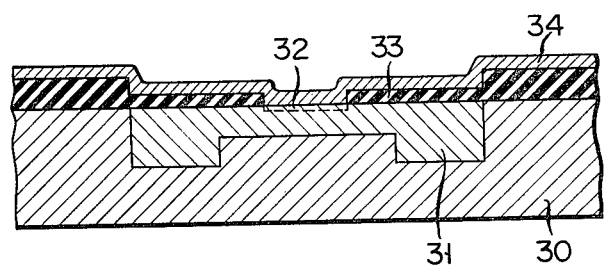
FIGS. 5A to 5E are views showing respective steps of the method for manufacturing a semiconductor device according to further embodiment of the invention.
Figure 5B:
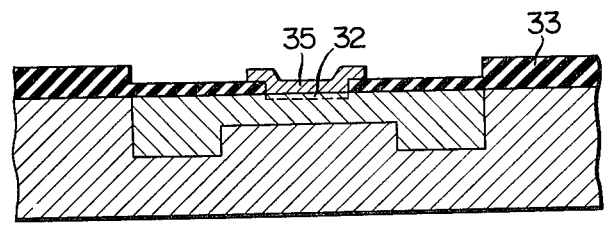

A p-type base region 31 is formed on one side of a single-crystal silicon substrate 30 of an n-type, which is to be a collector. An n-type region 32 of high impurity concentration is deposited on the portion of the base region by ion-implantation of the phosphorus or heat treatment in an oxidizing atmosphere of phosphorus through an opening of a silicon dioxide film 33. Then, a polycrystalline silicon layer 34 is vapor-deposited on the n-type region 32 and the silicon dioxide film 33, as shown in FIG. 5A. Next, the polycrystalline silicon layer 34 is partially removed by means of plasma-etching to form an emitter electrode 35, as shown in FIG. 5B.

Figure 5C:
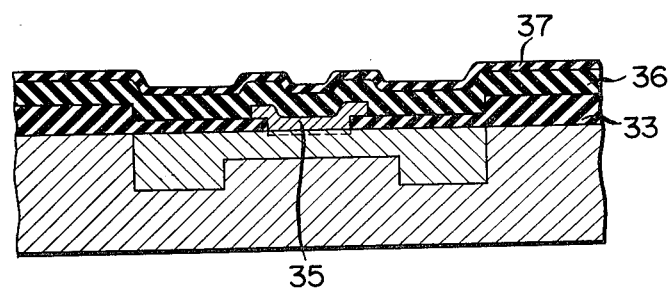

Subsequently, a silicon dioxide layer 36 is formed on the emitter electrode 35 and silicon dioxide layer 33, and then thereover a phosphorus-doped silicon glass layer 37 is covered by the heat treatment in a phosphorus oxychloride atmosphere so as to obtain a getter effect, as shown in FIG. 5C.

Figure 5D:
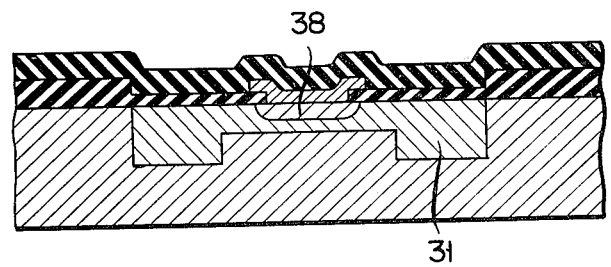

After the getter layer 37 is etched away, the resultant construction is heated at about 1000° C. for 40 minutes to diffuse phosphorus within the n-type region 32 into the base region 31 so as to form a shallow emitter region 38 of an n-type, as shown in FIG. 5D.

Figure 5E:
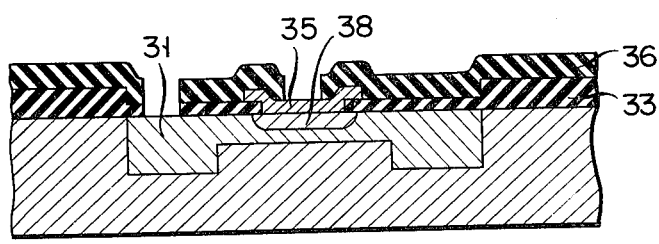

Finally the portions of the silicon dioxide layers 33, 36 are removed to partially expose the base region 31 and emitter electrode 35 to which base and emitter leads are to be taken out as shown in FIG. 5E.

Although in the above two embodiments the polycrystalline silicon film or layer formed on the n-type region obtained by depositing phosphorus thereon is not positively doped with impurities, it may be previously doped with an n-type impurity with a diffusion coefficient smaller than that of phosphorus, such as arsenic. By such doping, the specific resistance of the polycrystalline silicon electrode may be reduced.

As for the method of deposition, it is not limited to the method of using the oxidizing atmosphere of phosphorus oxychloride, but may be any method that enables phosphorus to stick in or onto the silicon substrate surface at a temperature to prohibit deep diffusion of the phosphorus into the substrate, including the ion-implantation method using phosphorus ions.

What is claimed is:

1. A method for manufacturing a semiconductor device comprising the steps of preparing a silicon substrate having a p-type region with an exposed surface on one side thereof, forming an n-type region by depositing phosphorus on said exposed surface of the p-type region, forming a polycrystalline silicon layer on said n-type region, and heating said n-type region to diffuse phosphorus within said n-type region into said p-type region and into said polycrystalline silicon layer to form a diffused region in said p-type region.

2. The method according to claim 1, wherein the step of forming the polycrystalline silicon layer includes the step of providing a polycrystalline silicon layer containing an n-type impurity with a diffusion speed lower than that of phosphorus for diffusing said n-type impurity into said diffused region during the heating step.

3. The method of claim 1 whereby the polycrystalline silicon layer is formed by the vapor-growth of silicon at 650° C.

4. The method of claim 1 wherein said heating step is carried out at approximately 1,000° C.

5. A method for manufacturing a semiconductor device comprising the steps of forming a p-type base region by diffusing an impurity into an n-type silicon substrate, covering all but one portion of said p-type base region with an insulating layer, forming an n-type region be depositing phosphorus on said one portion of said base region, forming a polycrystalline silicon layer on said n-type region and said insulating layer, and heating said n-type region to diffuse phosphorus within said n-type region into said base region to form an emitter region and to diffuse said phosphorus into said polycrystalline silicon layer.

6. The method according to claim 5, wherein the step of forming the polycrystalline silicon layer includes the step of providing a polycrystalline silicon layer containing a n-type impurity with a diffusion speed lower than that of phosphorus for diffusing said n-type impurity into said emitter region during the heating step.

7. The method of claim 5 wherein said step of covering includes depositing a layer of silicon dioxide by thermal oxidation.

8. The method of claim 5 wherein the heating step is carried out at 1,000° C.

9. The method according to claim 5 or 6 further comprising the step of selectively etching said polycrystalline silicon layer after said heating step to form an emitter electrode from the non-etched portion of said polycrystalline silicon layer.

10. The method according to claim 9 wherein before the step of heating, the method includes steps of successively forming an insulating layer and a phosphorus-doped silicon oxide layer to achieve a getter effect.

11. A method for manufacturing a semiconductor device comprising the steps of:
preparing a silicon substrate having a p-type region with an exposed surface on one side thereof;
forming an n-type region by depositing phosphorus on said exposed surface of the p-type region;
forming a polycrystalline silicon layer on said n-type region;
forming an insulating layer over said polycrystalline silicon layer;
forming a phosphorus-doped silicon glass layer on the surface of said silicon dioxide layer to achieve a getter effect; and
heating said n-type region to diffuse phosphorus within said n-type region into said p-type region and into said polycrystalline silicon layer to form a diffused region in said p-type region.

12. The method of claim 11 wherein said step of forming an insulation layer includes depositing a layer of silicon dioxide through the low-temperature vapor-growth of silicon.

13. The method of claim 11 further comprising the step of removing said phosphorus-doped silicon glass layer prior to the performance of said heating step.

14. The method of claim 13 further comprising the step of removing said insulation layer prior to the performance of said heating step.

15. A method for manufacturing a semiconductor device comprising the steps of:
forming a p-type base region by diffusing an impurity into an n-type silicon substrate,
covering all but one portion of said p-type base region with an insulating layer,
forming an n-type region by depositing phosphorus on said one portion of said base region,
forming a polycrystalline silicon layer on said n-type region and said insulating layer,
forming an insulating layer over said polycrystalline silicon layer,
forming a phosphorus-doped silicon glass layer on the surface of said silicon dioxide layer to achieve a getter effect; and
heating said n-type region to diffuse phosphorus within said n-type region into said base region to form an emitter region and to diffuse said phosphorus into said polycrystalline silicon layer.

16. The method of claim 15 wherein the steps of covering and forming an insulating layer both include depositing a layer of silicon dioxide.

17. The method of claim 15 further comprising the step of removing said phosphorus-doped silicon glass layer prior to the performance of said heating step.

18. The method of claim 17 further comprising the step of removing said insulation layer prior to the performance of said heating step.

* * * * *